US007082592B1

(12) United States Patent
Tharmalingam (10) Patent No.: US 7,082,592 B1
(45) Date of Patent: Jul. 25, 2006

(54) METHOD FOR PROGRAMMING PROGRAMMABLE LOGIC DEVICE HAVING SPECIALIZED FUNCTIONAL BLOCKS

(75) Inventor: Kumara Tharmalingam, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 515 days.

(21) Appl. No.: 10/463,688

(22) Filed: Jun. 16, 2003

(51) Int. Cl.
*G06F 17/50* (2006.01)

(52) U.S. Cl. ............................................ 716/17; 716/18
(58) Field of Classification Search ............. 716/16–18
See application file for complete search history.

(56) References Cited

U.S. PATENT DOCUMENTS

| | | | |
|---|---|---|---|
| 3,473,160 A | 10/1969 | Wahlstrom | 326/41 |
| 4,799,004 A | 1/1989 | Mori | 714/726 |
| 4,871,930 A | 10/1989 | Wong et al. | 326/39 |
| 4,912,345 A | 3/1990 | Steele et al. | 326/39 |
| 5,122,685 A | 6/1992 | Chan et al. | 326/41 |
| 5,128,559 A | 7/1992 | Steele | 326/38 |
| 5,197,016 A * | 3/1993 | Sugimoto et al. | 716/8 |
| RE34,363 E | 8/1993 | Freeman | 326/38 |
| 5,349,250 A | 9/1994 | New | 326/44 |
| 5,371,422 A | 12/1994 | Patel et al. | 326/41 |
| 5,483,178 A | 1/1996 | Costello et al. | 326/41 |
| 5,570,039 A | 10/1996 | Oswald et al. | 326/39 |
| 5,689,195 A | 11/1997 | Cliff et al. | 326/41 |
| 5,751,164 A | 5/1998 | Sharpe-Geisler et al. | 326/38 |
| 5,754,459 A | 5/1998 | Telikepalli | 708/627 |
| 5,812,562 A | 9/1998 | Baeg | 714/726 |
| 5,825,202 A | 10/1998 | Tavana et al. | 326/39 |
| 5,874,834 A | 2/1999 | New | 326/39 |
| 5,880,981 A | 3/1999 | Kojima et al. | 708/523 |
| 5,991,898 A | 11/1999 | Rajski et al. | 714/30 |
| 5,999,015 A | 12/1999 | Cliff et al. | 326/39 |
| 6,060,903 A | 5/2000 | Rangasayee et al. | 326/39 |
| 6,069,487 A | 5/2000 | Lane et al. | 326/37 |
| 6,078,941 A | 6/2000 | Jiang et al. | 708/625 |
| 6,091,262 A | 7/2000 | New | 326/39 |

(Continued)

FOREIGN PATENT DOCUMENTS

EP 0 167 047 1/1986

(Continued)

OTHER PUBLICATIONS

VIEWZ, "Removale Storage Guide", 2002, Viewz, http://www.viewz.com/shoppingguide/storageprint.htm pp. 1-10.*

(Continued)

*Primary Examiner*—Stacy A Whitmore
(74) *Attorney, Agent, or Firm*—Fish & Neave IP Group of Ropes & Gray LLP; Jeffrey H. Ingerman (57) ABSTRACT

A programming method efficiently programs programmable logic devices of the type having specialized functional blocks. Those blocks may include multipliers and other arithmetic function elements, or may be various types of memory blocks. In order to efficiently program devices having such specialized functional blocks, without using a larger device than necessary, and without failing to fit a user design to a device, if the programming method finds that that there are more functions to be performed in specialized functional blocks than there are specialized functional blocks available, the programming method attempts to map some of the specialized functions to generic programmable logic elements (or other resources), assuming there are sufficient programmable logic elements (or other resources) that otherwise would remain unused in the user design.

39 Claims, 5 Drawing Sheets

U.S. PATENT DOCUMENTS

| | | | |
|---|---|---|---|
| 6,094,065 | A | 7/2000 | Tavana et al. ............... 326/39 |
| 6,154,049 | A | 11/2000 | New ........................... 326/39 |
| 6,169,419 | B1 | 1/2001 | De et al. ...................... 326/58 |
| 6,172,518 | B1 * | 1/2001 | Jenkins et al. ............... 326/37 |
| 6,185,725 | B1 * | 2/2001 | Pedersen ..................... 716/17 |
| 6,195,788 | B1 * | 2/2001 | Leaver et al. ................ 716/18 |
| 6,215,326 | B1 | 4/2001 | Jefferson et al. ............ 326/41 |
| 6,230,307 | B1 * | 5/2001 | Davis et al. .................. 716/16 |
| 6,242,945 | B1 | 6/2001 | New ........................... 326/39 |
| 6,255,848 | B1 | 7/2001 | Schultz et al. ............... 326/41 |
| 6,259,275 | B1 | 7/2001 | Beiu .......................... 326/112 |
| 6,286,024 | B1 | 9/2001 | Yano et al. .................. 708/625 |
| 6,404,225 | B1 | 6/2002 | Rangasayee ................. 326/39 |
| 6,404,226 | B1 | 6/2002 | Schadt ........................ 326/41 |
| 6,407,576 | B1 * | 6/2002 | Ngai et al. ................... 326/41 |
| 6,408,422 | B1 * | 6/2002 | Hwang et al. ................ 716/3 |
| 6,473,726 | B1 * | 10/2002 | Reblewski ................... 703/26 |
| 6,481,001 | B1 * | 11/2002 | Moore ......................... 716/18 |
| 6,490,707 | B1 | 12/2002 | Baxter .......................... 716/2 |
| 6,515,509 | B1 | 2/2003 | Baxter ......................... 326/39 |
| 6,526,563 | B1 * | 2/2003 | Baxter ......................... 716/18 |
| 6,538,470 | B1 | 3/2003 | Langhammer et al. ....... 326/41 |
| 6,556,044 | B1 * | 4/2003 | Langhammer et al. ....... 326/40 |
| 6,628,140 | B1 * | 9/2003 | Langhammer et al. ....... 326/40 |
| 6,961,919 | B1 * | 11/2005 | Douglass ..................... 716/18 |
| 2002/0089348 | A1 | 7/2002 | Langhammer ............... 326/38 |

FOREIGN PATENT DOCUMENTS

| | | |
|---|---|---|
| EP | 0 461 798 | 12/1991 |
| GB | 2 283 602 | 5/1995 |
| WO | WO95/16993 | 6/1995 |

OTHER PUBLICATIONS

Altera Corp., "Implementing Multipliers in FLEX 10K EABs" (Mar. 1996).

Altera Corp., "Implementing Logic with the Embedded Array in FLEX 10K Devices (Version 2.1)" (May 2001).

Quicklogic Corp., *The QuickDSP Design Guide*, Rev. B (Aug. 2001).

Quicklogic Corp., "QuickDSP Family Data Sheet," Rev. B (Aug. 7, 2001).

Xilinx, Inc., "Xilinx Unveils New FPGA Architecture to Enable High-Performance, 10 Million System Gate Designs" (Jun. 22, 2000).

Xilinx, Inc.; "Xilinx Announces DSP Algorithms, Tools and Features for Virtex-II Architecture" (Nov. 21, 2000).

Xilinx, Inc., "Virtex-II 1.5V Field-Programmable Gate Arrays," module 2 of 4 (Jan. 25, 2001).

Xilinx, Inc., "Virtex-II 1.5V Field-Programmable Gate Arrays," module 1 of 4 (Apr. 2, 2001).

Xilinx, Inc., "Virtex-II 1.5V Field-Programmable Gate Arrays," module 2 of 4 (Apr. 2, 2001).

* cited by examiner

METHOD FOR PROGRAMMING PROGRAMMABLE LOGIC DEVICE HAVING SPECIALIZED FUNCTIONAL BLOCKS

BACKGROUND OF THE INVENTION

This invention relates to programmable logic devices having specialized functional blocks—i.e., blocks that perform functions other than generic programmable logic functions. More particularly, this invention relates to a method for programming such programmable logic devices efficiently when the specialized functions can also be implemented in generic programmable logic or other resources.

Programmable logic devices are well known. Early programmable logic devices were one-time configurable. For example, configuration may have been achieved by "blowing"—i.e., opening—fusible links. Alternatively, the configuration may have been stored in a programmable read-only memory. Those devices generally provided the user with the ability to configure the devices for "sum-of-products" (or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up-table-type logic operations.

As programmable logic devices have become larger, it has become more common to add dedicated blocks to perform particular functions that have become more common in programmable logic devices. For example, at some point, such devices began to be provided with embedded blocks of random access memory that could be configured by the user to act as random access memory, read-only memory, or logic (such as P-TERM logic); such embedded blocks might even be provided in different sizes on the same device. Other types of memory, such as read-only memory (ROM) or shift registers, also have been provided. More recently, multiplier circuits have been provided on programmable logic devices. Whereas in prior programmable logic devices space was not available for dedicated multipliers, current larger devices can accommodate multipliers. This spares users from having to create multipliers by configuring the available logic. Moreover, as described in commonly-assigned U.S. Pat. No. 6,538,470, which is hereby incorporated by reference in its entirety, specialized multiplier blocks may be provided including multipliers and other arithmetic circuits such as adders and/or subtracters and/or accumulators. Such blocks are sometimes referred to as "multiplier-accumulator blocks" or "MAC blocks." Such blocks, for example, may be useful in digital signal processing, such as is performed in audio applications, and therefore such specialized multiplier blocks also are sometimes referred to as "DSP blocks."

While it may have been possible to program the earliest programmable logic devices manually, simply by determining mentally where various elements should be laid out, it was common even in connection with such earlier devices to provide programming software that allowed a user to lay out logic as desired and then translate that logic into programming for the programmable logic device. With current larger devices, it would be impractical to attempt to lay out the logic without such software.

The aforementioned specialized blocks present issues that had not existed in prior generations of programmable logic devices. In particular, because such blocks may be relatively large and/or complex, the number of such blocks on any one device may be relatively small. If a user design calls for using a certain number of such blocks, or for performing certain functions that are inferred by the programming software to be performed by such blocks, and the number of such blocks called for by such a user design exceeds the number of such blocks available on a device, previously known programming software would call for a larger device than necessary, or would indicate that the user design cannot be fit on the device (where the user specified a particular device or even the largest device is insufficient)—i.e., a "no-fit" result would be generated. This is so even where it might be possible to implement some of the "specialized" functions in generic programmable logic or in other device resources and doing so might be more efficient than using a larger device (or if the user specified a particular device so that a larger device is not an option, or if there is no larger device). It would be desirable if any programming software or method used with such devices would be able to implement a user logic design taking into account the possibility of performing specialized functions in programmable logic or other resources even where specialized functional blocks are present.

SUMMARY OF THE INVENTION

In accordance with this invention, there is provided a method, which may be implemented in software, for programming a programmable logic device incorporating specialized functional blocks. When processing functions defined by the user for implementation in a specialized functional block, or functions inferred by the software from the design to be implemented in a specialized functional block, the method takes into account the possibility of performing some of those functions in programmable logic or other resources before returning a no-fit result or selecting a larger device. The invention may select which specialized functions to convert to other resources simply in the order in which they appear in the user description of the design, or the impact of the conversion from specialized functions to other resources may be taken into account. For example, the method could take into account how many of the other resources the different specialized functions may consume if converted, or could take into account which specialized functions are in more time-critical paths (meaning that they should not be converted to be implemented in slower resources), or any combination of those or other criteria.

In a method according to the invention, for use with a programmable logic device including specialized functional blocks that perform specialized functions that also can be performed in other resources of the programmable logic device, there is provided a method of programming such a programmable logic device with a user design. The method includes parsing a list of programming elements for the user design and identifying, in the list of programming elements for the user design, programming elements related to the specialized functional blocks. A programmable logic device is selected having a predetermined number of specialized functional blocks and a predetermined number of the other resources. When the programming elements related to the specialized functional blocks exceed, in number, the capacity of the predetermined number of specialized functional blocks to perform the specialized functions, a portion of the programming elements related to the specialized functional blocks are mapped onto the other resources.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The present invention may be implemented in software for programming a user design into a programmable logic device. Such software is typically provided as a design tool by the manufacturer of the programmable logic device. For example, the method of the present invention may be incorporated into the QUARTUS® II programming tool software available from Altera Corporation, of San Jose, Calif. While such software generally is designed for particular programmable logic devices, the method according to the invention can be incorporated into any such software. As such, the method of the present invention includes the ability to read a description, provided to the software, of the physical parameters of a particular programmable logic device on which a logic design is to be implemented, and to take into account the physical constraints of that particular programmable logic device, without the method of the invention itself being limited to any particular programmable logic device.

As discussed above, the method according to the present invention uses its "knowledge" of the number and distribution of specialized functional blocks, as well as its "knowledge" of how such blocks, or portions thereof, may be implemented in programmable logic, to lay out those functions of a user design that are to be implemented in the specialized functional blocks in an efficient way, to allow a user design, if possible, to be fit to a device even if the number of specialized functional blocks on the device is insufficient for the number of specialized functions called for by the user design.

In cases where the user has specified a particular model of device, the invention may prevent a no-fit situation by implementing one or more of the specialized functions in ordinary programmable logic. In cases where the user has not specified a particular device, the invention may be able to select a smaller device to implement a design than might be expected based on the number of specialized functions to be performed. In such a case, rather than selecting a device large enough for all of the specialized functions to be implemented in specialized functional blocks, the invention may be able to select a smaller device by implementing one or more of the specialized functions in generic programmable logic or in other resources such as memory.

The description that follows may describe the invention in particular with respect to the "MAC" or "DSP" blocks referred to above. However, it is substantially equally applicable to any sort of specialized functional block that can be implemented in programmable logic, or indeed by using any other resources available on the programmable logic device. For example, both random-access memory and read-only memory, as well as shift registers, can be implemented in programmable logic. Thus, where a device includes dedicated random-access memory, read-only memory or shift registers, the present invention may apply, implementing in programmable logic certain portions of a user design calling for random-access memory, read-only memory or shift registers, which might have been expected to be performed by specialized functional blocks dedicated to those functions. Similarly, if a programmable logic device has different-sized memory blocks embedded therein, a user design that might be expected to be implemented in a larger memory block might be divided among smaller memory blocks. More generally, where one or more types of specialized functional blocks are provided, functions that might be expected to be performed in those specialized functional blocks may be implemented instead in some combination of other resources on the device, including combinations that incorporate different types of specialized functional blocks.

Similarly, the method according to the invention can be advantageously carried out at various stages of the programming process, including synthesis, technology-mapping, clustering, placing-and-routing, etc. Although the invention will be described herein primarily in the context of synthesis, the claims which follow should not be considered so limited.

The invention will now be described with reference to FIGS. 1–5.

Figure 1:
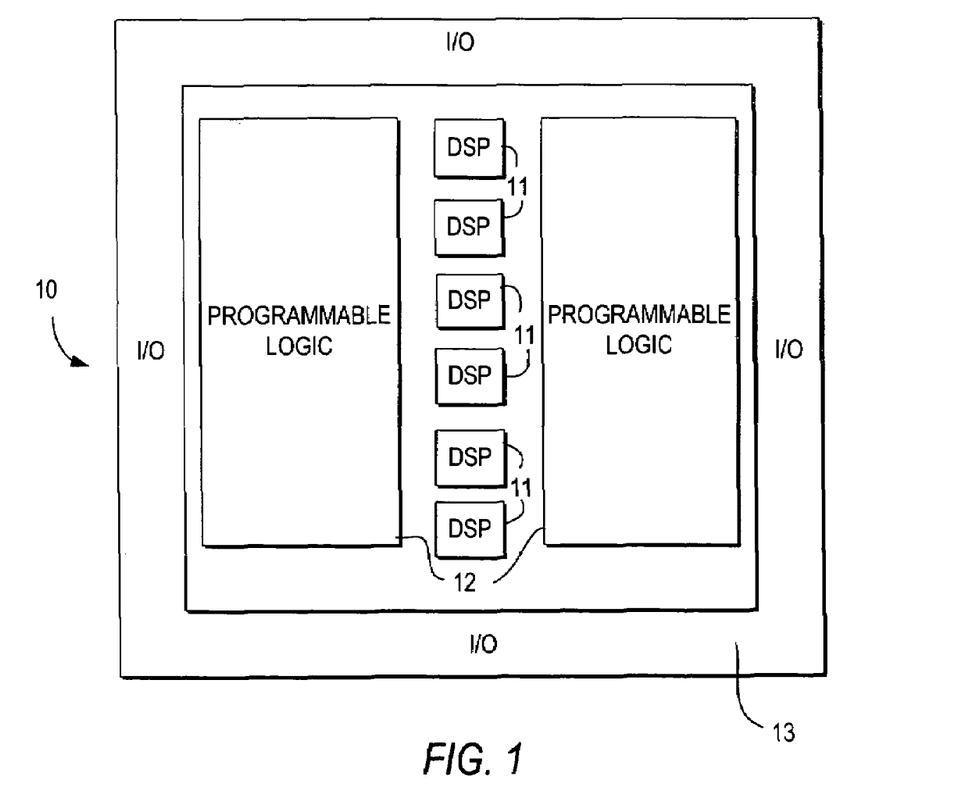
FIG. 1 is a schematic representation of a programmable logic device incorporating specialized functional blocks, with which device the present invention may be used.

FIG. 1 shows the circuitry of a preferred embodiment of a programmable logic device ("PLD") 10 of the type described above incorporating specialized functional blocks 11, as well as regions 12 of programmable logic containing numerous programmable logic elements ("LEs") (not shown). PLD 10 preferably also includes input/output ("I/O") regions 13 and suitable programmable interconnect structures (not shown). One type of specialized functional block may be a specialized multiplier block ("DSP") as described above. Such a specialized multiplier block preferably includes four multipliers. In a preferred embodiment, each of the four multipliers is an 18-bit-×-18-bit multiplier, meaning that each can determine, as a 36-bit binary output, the product of two 18-bit binary multiplicand inputs, or the two products (concatenated into one 36-bit number) of two pairs of 9-bit binary multiplicand inputs (concatenated into one pair of 18-bit numbers). Each specialized multiplier block 11 preferably also includes a number of adder/subtracters allowing the performance of addition and subtraction of the outputs of the various multipliers, as well as—in the case of an adder/subtracter when used with a register—an accumulator function. Additional registers, along with multiplexers, allow the construction of other combinations of sums and differences of the registered or unregistered products of the four multipliers. Multiplexers also allow the various multipliers to share inputs, which may be registered or unregistered.

Figure 2:
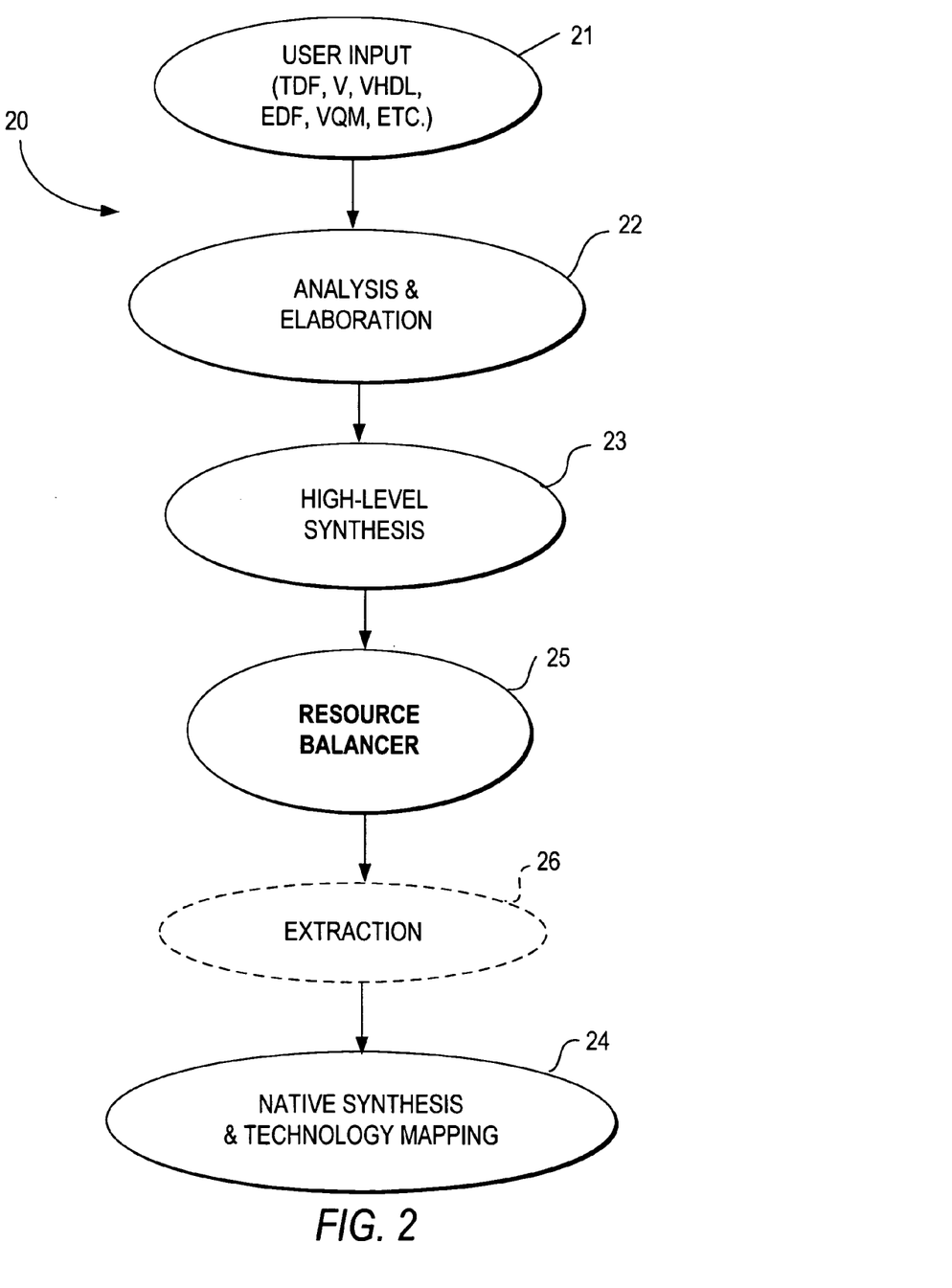
FIG. 2 is a flow diagram representing a preferred embodiment of the method according to the present invention for programming a programmable logic device with a user design incorporating specialized functions.

According to the invention, a user design that includes functions that may be performed by one or more specialized functional blocks 11 may be programmed as shown in FIG. 2, which illustrates a preferred embodiment of a programmable logic device programming method 20 according to the invention. A user inputs a user design at 21 using an interface provided for that purpose, which may be any hardware description language or text-based representation (such as those indicated in the drawing) or a graphical representation. Next, at step 22, the user design is processed by a conventional analysis and elaboration tool to convert the user description to a netlist of elements. At step 23, high-level synthesis is carried out. For example, if the user design includes combinations of multiplications and additions that could be implemented in a specialized functional block but the user did not specify that they should, or if the user did so specify, but the user did not specify the particular combinations, then at step 23 those operations are converted to specialized functional block operations. Steps 22 and 23 may be carried out by conventional tools such as those included within the aforementioned QUARTUS® II software, or any other analysis and synthesis tools—including, as examples only, the SYNPLICITY® and SYNPLICITY PRO® tools available from Synplicity, Inc., of Sunnyvale, Calif., and the LeonardoSpectrum™ tool available from Mentor Graphics Corporation, of Wilsonville, Oreg.—that converts the user design to PLD function blocks. In order to accomplish this function, the synthesis tool is programmed with the structure of the PLD for which the design is intended, so that it "knows" what type of elements are legal for the chosen device. The result of step 23 is a netlist of function blocks and logic gates, which ordinarily could be input to native, or "gate-level," synthesis step 24 which performs further gate-level optimizations and then converts the design to LEs and other resources prior to conventional place-and-route processing.

However, in accordance with the present invention, the results of step 23 preferably are first processed in resource balancing step 25 and, optionally, extraction step 26 prior to native synthesis step 24. It is preferred that at this point all functions have been reduced to their most basic elements, meaning that the netlist produced in step 23 does not include any functional blocks that can be broken down further, and that there are no processes still to be performed that might reduce any functions to more basic elements. The reason is that resource balancing step 25 preferably should "know" about all functions at their most basic level, so that it knows what functions are available to convert to logic. If it turns out, for example, that there are functions that can be broken down further, the results of resource balancing step 25 may lead unnecessarily to fitting problems, because if functions are later broken down in subsequent processing, it may turn out that the elements into which those functions are broken down are the ones that should have been converted to logic. Moreover, any such additional functions will consume resources, and therefore resource balancing step 25 will have been conducted with an inaccurate "understanding" of which resources would be available for converting functions to logic.

Figure 3:
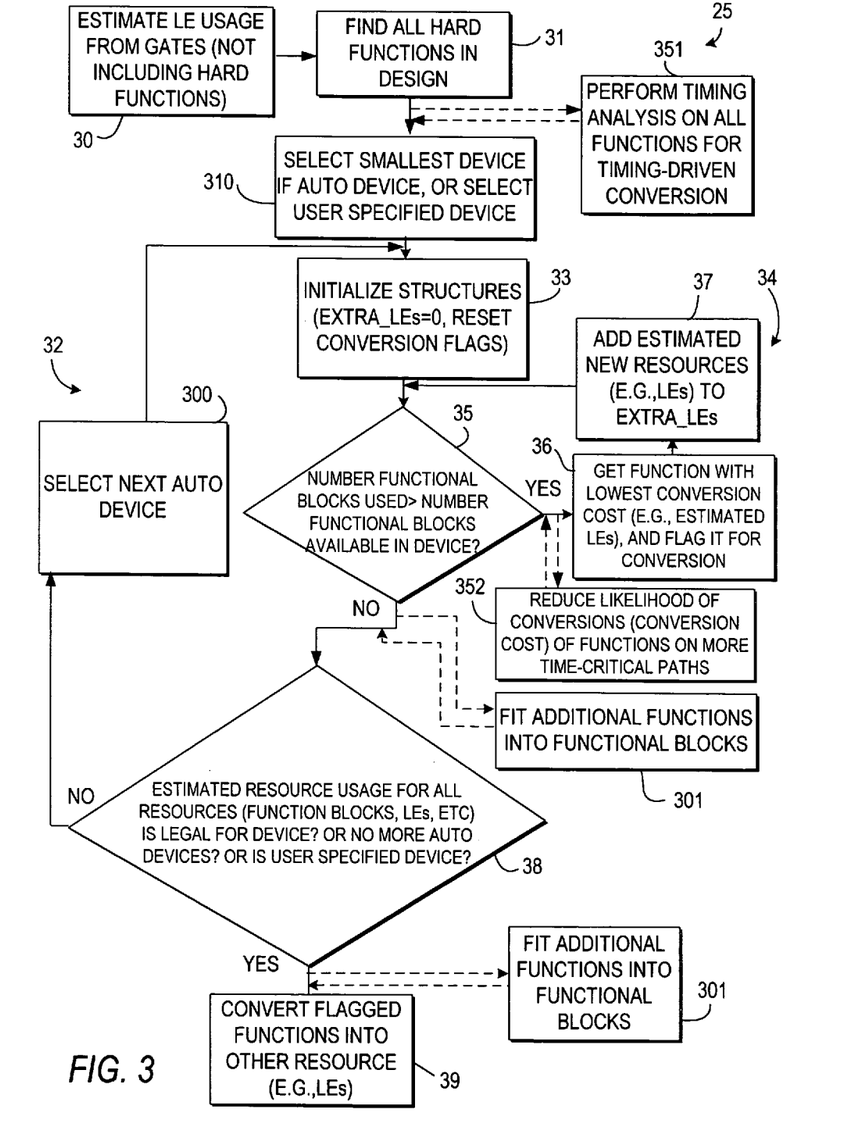
FIG. 3 is a flow diagram of preferred embodiment of the resource balancing step of FIG. 2.

The details of resource balancing step 25 are shown in FIG. 3. The process preferably begins at step 30 where the number of LEs required by the user design (exclusive of specialized functions that may be converted to programmable logic in accordance with the process) is estimated. One way of performing the estimating in step 30 will be described below. After step 30, the process moves to step 31 where preferably all specialized functions are identified. This step may use the output of step 23, above, in which the specialized functions are synthesized from the user design input.

At step 310, a particular PLD, into which an attempt is to be made to fit the user design, preferably is selected. If the user has selected a particular model of PLD, then that model device is selected. If the user has chosen to have the process select the device, then in the first instance the smallest available device is selected.

The process next enters an outer loop 32 where at initialization step 33, a counter for the number of LEs needed to convert specialized functions to logic preferably is reset to zero. If any other type of resource may be converted, there may be a counter for that type of resource and that counter also may be reset at this step. Also, flags specifying that particular functions should be converted preferably are reset. The process then enters an inner loop 34 where at test 35 the number of specialized functional blocks used by the specialized functions in the design preferably is compared to the number of specialized functional blocks available on the selected PLD. It is important to note that preferably it is the number of specialized functional blocks, not the number of specialized functions, that is compared. For example, the aforementioned specialized multiplier block could be used as up to four 18-by-18-bit multipliers, or one 36-by-36-bit multiplier, or two multiplier/accumulators, so the number of functions may differ from the number of functional blocks.

If the result of test 35 is that the number of specialized functional blocks in the design exceeds the number of specialized functional blocks available on the selected PLD, that means that the design can fit on the selected device, if at all, only if one or more specialized functions are converted to other resources such as programmable logic. Therefore, at step 36 one of the specialized functions is marked for conversion to programmable logic. Preferably, as part of this step, before any one specialized function is marked for conversion, all of the specialized functions are examined and the number of LEs (or other resources) needed to convert each to logic (or other resources) is estimated (again as described below). Preferably, the specialized function whose conversion would consume the fewest LEs (or other resources) is the one selected. Optionally, after step 31, at step 351, a timing analysis is performed on each specialized function, and then, before step 36 that timing analysis can be used to determine if any specialized function is located in a time-critical path, and any such time-critical function preferably is marked as having a preference not to be converted to LEs (or other resources). At step 37 the number of LEs (or other resources) needed for the conversion preferably is added to the count (see step 33) of LEs (or other resources) needed. The process then returns to test 35 to determine if the number of specialized functional blocks in the design exceeds the number of specialized functional blocks available on the selected PLD, then inner loop 34 preferably is executed again, and preferably iteratively until at test 35 the number of specialized functional blocks in the design does not exceed the number of specialized functional blocks available on the selected PLD.

If at test 35 (whether on the first pass or a subsequent pass) the number of specialized functional blocks in the design does not exceed the number of specialized functional blocks available on the selected PLD, then the process continues to test 38 to determine if any one of three things is true, in which case the process moves on to step 39. First, test 38 determines if the user has specified a particular PLD. Second, if the user has not specified a particular PLD, then test 38 determines whether the particular PLD under consideration is already the largest available device. Third, if the user has not specified a particular PLD, test 38 determines if the total estimated LE (or other resource) usage (the sum of the estimated usage for the base design in step 30 and the additional usage for converted specialized functions in step 37) does not exceed the available resources of the device. If any of those three things is true, then the process preferably continues to step 39 where the flagged specialized functions are converted to logic (or other resources). Preferably, but not necessarily, the conversion in step 39 is to macro representations, sometimes referred to as "cores" or "megafunctions," representing the desired logic (or other) functions. If so, then at optional step 26 the actual logic elements (or other resources) are extracted from the macro representations. Alternatively, at step 39 the flagged specialized functions can be converted directly to LEs (or other resources).

If at test 38 none of the three conditions is true, then the process continues to step 300 where the next largest available PLD is selected and then outer loop 32 is executed again, iteratively, until one of the conditions at test 38 is true.

If step 25 as depicted in FIG. 3 is being carried out during actual fitting, then each time the description above of FIG. 3 refers to estimating the number of LEs (or other resources) being used, the process would likely know the actual number rather than an estimate. And at that stage, if the number of LEs (or other resources) used exceeds the number available in the largest available device or in the user-specified device, then a failure or "no-fit" may occur. However, if step 25 as depicted in FIG. 3 is being carried out during synthesis, then the estimates are truly estimates and no "no-fit" is declared, because the actual technology-mapping process may allocate LEs (or other resources) more efficiently than the estimates, so that a design actually can be fit on the device. If the estimates during synthesis turn out to be correct, the "no-fit" is simply allowed to occur later, during fitting.

As stated, during synthesis estimates are made of the number of LEs (or other resources) to be used to convert a specialized function. For example, in the case where the specialized functions are those associated with a specialized multiplier block—i.e., multipliers, adders and accumulators—in the STRATIX® line of products by Altera Corporation, of San Jose, Calif., then preferred estimates may be as follows:

1. For every multiplier with a result width between 1 and 4, the number of LEs may be estimated as the product of the widths of the multiplier inputs;

2. For every multiplier with a result width between 5 and 9, the number of LEs may be estimated as the product of the widths of the multiplier inputs, further multiplied by a constant, which preferably is 2;

3. For every multiplier with a result width greater than 10, the number of LEs may be estimated as the product of the widths of the multiplier inputs, further multiplied by a larger constant, which preferably is 2.23; and 4. For every adder or accumulator, the number of LEs may be estimated as the result width of the adder or accumulator.

Because, as noted above, each specialized functional block in a PLD may be able to carry out more than one specialized function (e.g., a multiplier block can implement up to four multipliers), and because the order in which the user design is processed may result in specialized functions being assigned to specialized functional blocks in a way that leaves room in certain specialized functional blocks for other specialized functions, then optionally at step 301, the specialized functions in the design are grouped in order of decreasing numbers of LEs (or other resources), and optionally in order of decreasing degree of time-criticality, needed to implement each function. An attempt is then made to find room in a partially used specialized functional block for each specialized function that has been designated for conversion to LEs (or other resources) (starting with those functions that would consume the most LEs or other resources, or with those that are the most time-critical). Step 301 can be carried out between test 35 and test 38, or between test 38 and step 39, as discussed below.

If carried out between test 35 and test 38, step 301 may free up sufficient LEs (or other resources) to prevent a "no-fit" where the user has specified a particular device or where the method has already selected the largest available device, or to avoid the need for the method to select a larger device if the largest device has not yet been selected, or to improve critical path timing. If carried out between test 38 and step 39, step 301 may similarly prevent a "no-fit" or improve timing, but will not be able to prevent the method from selecting a larger device than necessary.

PLDs programmed in accordance with the invention may be used in many kinds of electronic devices. One possible use is in a data processing system that also may include one or more of the following components: a processor; memory; I/O circuitry; and peripheral devices. These components may be coupled together by a system bus and are populated on a circuit board which is contained in an end-user system.

The end user system can be used in a wide variety of applications, such as computer networking, data networking, instrumentation, video processing, digital signal processing, or any other application where the advantage of using programmable or reprogrammable logic is desirable. The PLD can be used to perform a variety of different logic functions. For example, the PLD can be configured as a processor or controller that works in cooperation with the main system processor. The PLD may also be used as an arbiter for arbitrating access to shared resources in the system. In yet another example, the PLD can be configured as an interface between the processor and one of the other components in the system.

Various technologies can be used to implement PLDs of the type described above and that can be programmed according to this invention.

Instructions for carrying out the method according to this invention may be encoded on a machine-readable medium, to be executed by a suitable computer or similar device to implement the method of the invention for programming PLDs. For example, a personal computer may be equipped with an interface to which a PLD can be connected, and the personal computer can be used by a user to program the PLD using a suitable software tool, such as the QUARTUS® II software described above.

Figure 4:
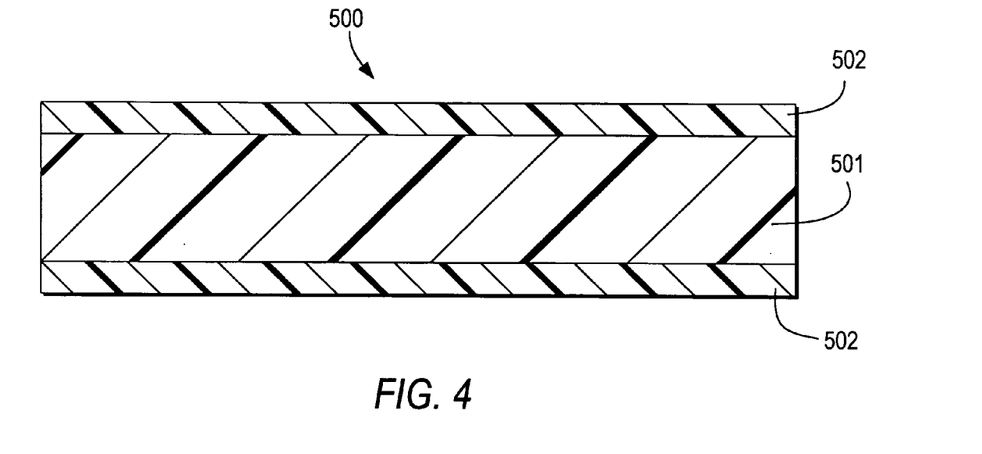
FIG. 4 is a cross-sectional view of a magnetic data storage medium encoded with a set of machine-executable instructions for performing the method according to the present invention.

FIG. 4 presents a cross section of a magnetic data storage medium 500 which can be encoded with a machine executable program that can be carried out by systems such as the aforementioned personal computer, or other computer or similar device. Medium 500 can be a floppy diskette or hard disk, or magnetic tape, having a suitable substrate 501, which may be conventional, and a suitable coating 502, which may be conventional, on one or both sides, containing magnetic domains (not visible) whose polarity or orientation can be altered magnetically. Except in the case where it is magnetic tape, medium 500 may also have an opening (not shown) for receiving the spindle of a disk drive or other data storage device.

The magnetic domains of coating 502 of medium 500 are polarized or oriented so as to encode, in manner which may be conventional, a machine-executable program such as that described above in connection with FIGS. 2–3, for execution by a programming system such as a personal computer or other computer or similar system, having a socket or peripheral attachment into which the PLD to be programmed may be inserted.

Figure 5:
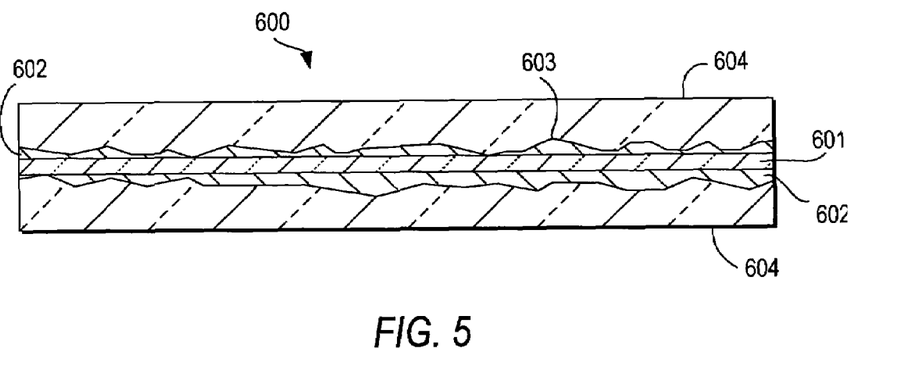
FIG. 5 is a cross-sectional view of an optically readable data storage medium encoded with a set of machine executable instructions for performing the method according to the present invention.

FIG. 5 shows a cross section of an optically readable data storage medium 600 which also can be encoded with such a machine-executable program, which can be carried out by systems such as the aforementioned personal computer, or other computer or similar device. Medium 600 can be a conventional compact disk read only memory (CD-ROM) or digital video disk read only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 600 preferably has a suitable substrate 601, which may be conventional, and a suitable coating 602, which may be conventional, usually on one or both sides of substrate 601.

In the case of a CD-based or DVD-based medium, as is well known, coating 602 is reflective and is impressed with a plurality of pits 603, arranged on one or more layers, to encode the machine-executable program. The arrangement of pits is read by reflecting laser light off the surface of coating 602. A protective coating 604, which preferably is substantially transparent, is provided on top of coating 602.

In the case of magneto-optical disk, as is well known, coating 602 has no pits 603, but has a plurality of magnetic domains whose polarity or orientation can be changed magnetically when heated above a certain temperature, as by a laser (not shown). The orientation of the domains can be read by measuring the polarization of laser light reflected from coating 602. The arrangement of the domains encodes the program as described above.

It will be understood that the foregoing is only illustrative of the principles of the invention, and that various modifications can be made by those skilled in the art without departing from the scope and spirit of the invention, and the present invention is limited only by the claims that follow.

What is claimed is:

1. For use with a programmable logic device including specialized functional blocks that perform specialized functions that also can be performed in other resources of the programmable logic device different from said specialized functional blocks, a method of programming such a programmable logic device with a user design, said method comprising:
   parsing a list of programming elements for said user design;
   identifying, in said list of programming elements for said user design, programming elements related to said specialized functional blocks;
   selecting a programmable logic device having a predetermined number of specialized functional blocks and a predetermined number of said other resources different from said specialized functional blocks; and
   when said programming elements related to said specialized functional blocks exceed, in number, capacity of said predetermined number of specialized functional blocks to perform said specialized functions, mapping a portion of said programming elements related to said specialized functional blocks onto said other resources different from said specialized functional blocks.

2. The method of claim 1 wherein:
   said other resources different from said specialized functional blocks comprise programmable logic elements; and
   said mapping a portion of said programming elements related to said specialized functional blocks onto said other resources different from said specialized functional blocks comprises mapping a portion of said programming elements related to said specialized functional blocks onto said programmable logic elements.

3. The method of claim 1 wherein:
   said other resources different from said specialized functional blocks comprise memory elements; and
   said mapping a portion of said programming elements related to said specialized functional blocks onto said other resources different from said specialized functional blocks comprises mapping a portion of said programming elements related to said specialized functional blocks onto said memory elements.

4. The method of claim 1 wherein:
   said other resources different from said specialized functional blocks comprise other types of specialized functional blocks; and
   said mapping a portion of said programming elements related to said specialized functional blocks onto said other resources different from said specialized functional blocks comprises mapping a portion of said programming elements related to said specialized functional blocks onto said other types of specialized functional blocks.

5. The method of claim 1 further comprising reading a description file for said programmable logic device to determine number and location of said specialized functional blocks; whereby:
   said method operates with any programmable logic device (a) having said specialized functional blocks, and (b) for which said description file is available.

6. The method of claim 1 further comprising:
   performing timing analysis on said programming elements related to said specialized functional blocks; and
   assigning a preference against said mapping any of said programming elements, related to said specialized functional blocks, in time-critical paths.

7. The method of claim 1 wherein said identifying programming elements related to said specialized functional blocks comprises identifying programming elements designated by said user as relating to one or more of said specialized functional blocks.

8. The method of claim 1 wherein said identifying programming elements related to said specialized functional blocks is carried out with regard to at least one of said programming elements without user intervention.

9. The method of claim 8 wherein said identifying comprises inferring an identification based on presence in said programming elements of functions for which said specialized functional blocks are designed.

10. The method of claim 8 wherein said identifying programming elements related to said specialized functional blocks comprises identifying programming elements related to at least one memory element.

11. The method of claim 8 wherein said identifying programming elements related to said specialized functional blocks comprises identifying programming elements related to at least one multiplier.

12. The method of claim 11 wherein said identifying programming elements related to said specialized functional blocks comprises identifying programming elements related to at least one multiplier and to at least one other arithmetic operator associated with said at least one multiplier.

13. The method of claim 12 wherein said at least one arithmetic operator is selected from the group consisting of addition, subtraction, accumulation, and combinations thereof.

14. The method of claim 1 wherein said selecting comprises selecting a programmable logic device based on user input.

15. The method of claim 1 wherein said selecting comprises selecting a programmable logic device from among a group of available programmable logic devices.

16. The method of claim 15 further comprising:
making an initial determination, prior to said mapping, of a number of said other resources different from said specialized functional blocks required for said user design;
making a subsequent determination, after said mapping, of a number of said other resources different from said specialized functional blocks consumed by said mapping;
comparing a sum of said number from said initial determination and said number from said subsequent determination to said predetermined number of said other resources different from said specialized functional blocks; and
when said sum exceeds said predetermined number:
reselecting a programmable logic device having a number of said other resources different from said specialized functional blocks larger than said predetermined number of said other resources different from said specialized functional blocks and a number of specialized functional blocks larger than said predetermined number of specialized functional blocks, and
when said programming elements related to said specialized functional blocks exceed, in number, capacity of said number of specialized functional blocks larger than said predetermined number of specialized functional blocks, repeating said mapping.

17. A data storage medium encoded with machine-executable instructions for performing a method, for use with a programmable logic device including specialized functional blocks that perform specialized functions that also can be performed in other resources of said programmable logic device different from said specialized functional blocks, of programming such a programmable logic device with a user design, said method comprising:
parsing a list of programming elements for said user design;
identifying, in said list of programming elements for said user design, programming elements related to said specialized functional blocks;
selecting a programmable logic device having a predetermined number of specialized functional blocks and a predetermined number of said other resources different from said specialized functional blocks; and
when said programming elements related to said specialized functional blocks exceed, in number, capacity of said predetermined number of specialized functional blocks to perform said specialized functions, mapping a portion of said programming elements related to said specialized functional blocks onto said other resources different from said specialized functional blocks.

18. The data storage medium of claim 17 wherein, in said method:
said other resources different from said specialized functional blocks comprise programmable logic elements; and
said mapping a portion of said programming elements related to said specialized functional blocks onto said other resources different from said specialized functional blocks comprises mapping a portion of said programming elements related to said specialized functional blocks onto said programmable logic elements.

19. The data storage medium of claim 17 wherein, in said method:
said other resources different from said specialized functional blocks comprise memory elements; and
said mapping a portion of said programming elements related to said specialized functional blocks onto said other resources different from said specialized functional blocks comprises mapping a portion of said programming elements related to said specialized functional blocks onto said memory elements.

20. The data storage medium of claim 17 wherein, in said method:
said other resources different from said specialized functional blocks comprise other types of specialized functional blocks; and
said mapping a portion of said programming elements related to said specialized functional blocks onto said other resources different from said specialized functional blocks comprises mapping a portion of said programming elements related to said specialized functional blocks onto said other types of specialized functional blocks.

21. The data storage medium of claim 17 further encoded with machine-executable instructions for reading a description file for said programmable logic device to determine number and location of said specialized functional blocks; whereby:
said method operates with any programmable logic device (a) having said specialized functional blocks, and (b) for which said description file is available.

22. The data storage medium of claim 17 further encoded with machine-executable instructions for:
performing timing analysis on said programming elements related to said specialized functional blocks; and
assigning a preference against said mapping any of said programming elements, related to said specialized functional blocks, in time-critical paths.

23. The data storage medium of claim 17 wherein in said method said identifying programming elements related to said specialized functional blocks comprises identifying programming elements designated by said user as relating to one or more of said specialized functional blocks.

24. The data storage medium of claim 17 wherein in said method said identifying programming elements related to said specialized functional blocks is carried out without user intervention.

25. The data storage medium of claim 24 wherein in said method said identifying comprises inferring an identification based on presence in said programming elements of functions for which said specialized functional blocks are designed.

26. The data storage medium of claim 24 wherein in said method said identifying programming elements related to said specialized functional blocks comprises identifying programming elements related to at least one memory element.

27. The data storage medium of claim 24 wherein in said method said identifying programming elements related to said specialized functional blocks comprises identifying programming elements related to at least one multiplier.

28. The data storage medium of claim 27 wherein in said method said identifying programming elements related to said specialized functional blocks comprises identifying programming elements related to at least one multiplier and to at least one other arithmetic operator associated with said at least one multiplier.

29. The data storage medium of claim 28 wherein said at least one arithmetic operator is selected from the group consisting of addition, subtraction, accumulation, and combinations thereof.

30. The data storage medium of claim 17 wherein in said method said selecting comprises selecting a programmable logic device based on user input.

31. The data storage medium of claim 17 wherein in said method said selecting comprises selecting a programmable logic device from among a group of available programmable logic devices.

32. The data storage medium of claim 31 further encoded with machine-executable instructions for:
    making an initial determination, prior to said mapping, of a number of said other resources different from said specialized functional blocks required for said user design;
    making a subsequent determination, after said mapping, of a number of said other resources different from said specialized functional blocks consumed by said mapping;
    comparing a sum of said number from said initial determination and said number from said subsequent determination to said predetermined number of said other resources different from said specialized functional blocks; and
    when said sum exceeds said predetermined number:
    reselecting a programmable logic device having a number of said other resources different from said specialized functional blocks larger than said predetermined number of programmable logic elements and a number of specialized functional blocks larger than said predetermined number of specialized functional blocks, and
    when said programming elements related to said specialized functional blocks exceed, in number, capacity of said number of specialized functional blocks larger than said predetermined number of specialized functional blocks, repeating said mapping.

33. The data storage medium of claim 17 wherein said data storage medium is magnetic.

34. The magnetic data storage medium of claim 33, where said data storage medium is a floppy diskette.

35. The magnetic data storage medium of claim 33, where said data storage medium is a hard disk.

36. The magnetic data storage medium of claim 33 wherein said data storage medium is magnetic tape.

37. The data storage medium of claim 17 wherein said data storage medium is optically readable.

38. The optically readable data storage medium of claim 37, wherein said data storage medium is selected from the group consisting of (a) a CD-ROM, (b) a CD-R, (c) a CD-RW, (d) a DVD-ROM, (e) a DVD-R, (f) a DVD-RW, (g) a DVD+R, (h) a DVD+RW and (i) a DVD-RAM.

39. The optically readable data storage medium of claim 37 wherein said data storage medium is a magneto-optical disk.

* * * * *